United States Patent [19]

Töpfer

[11] 4,331,099
[45] May 25, 1982

[54] METERING DEVICE FOR LACQUER

[75] Inventor: Dieter Töpfer, Heidenrod, Fed. Rep. of Germany

[73] Assignee: Hoechst Aktiengesellschaft, Frankfurt am Main, Fed. Rep. of Germany

[21] Appl. No.: 188,040

[22] Filed: Sep. 17, 1980

[30] Foreign Application Priority Data

Sep. 24, 1979 [DE] Fed. Rep. of Germany ....... 2938521

[51] Int. Cl.³ ............................................. B05C 3/18
[52] U.S. Cl. ................................. 118/413; 118/415; 354/317
[58] Field of Search ...................... 118/410, 413, 415; 354/317

[56] References Cited

U.S. PATENT DOCUMENTS

| 2,015,154 | 9/1935 | Palm | 118/415 X |
| 2,069,322 | 2/1937 | Mellor et al. | 118/413 |
| 3,970,040 | 7/1976 | Porth et al. | |
| 4,085,672 | 4/1978 | Grosart . | |
| 4,102,266 | 7/1978 | Porth . | |
| 4,215,927 | 8/1980 | Grant et al. | 118/119 X |

FOREIGN PATENT DOCUMENTS 2751371 of 0000 Fed. Rep. of Germany .
814216 6/1959 United Kingdom ................ 118/415

Primary Examiner—John P. McIntosh
Attorney, Agent, or Firm—Schwartz, Jeffery, Schwaab, Mack, Blumenthal & Koch

[57] ABSTRACT

Disclosed is a metering device for the application of lacquer to printing plates 16, comprising a first doctor blade 1 which serves as a damming-up blade and a second doctor blade 2 acting as a metering blade. The two flexible blades are arranged parallel to one another and are inclined toward the surface of the printing plate. They define a lacquer bath 3 into which lacquer is metered via a spray tube 7 having outlet openings 19. The first doctor blade 1 can be adjusted in height, and adjustment is effected in such a way that the lower edge of the blade 1 is in sealing contact with the printing plate 16. The second doctor blade 2 is fastened to an adjusting means 6 and its height can be chosen independently of the position of the first doctor blade.

7 Claims, 2 Drawing Figures

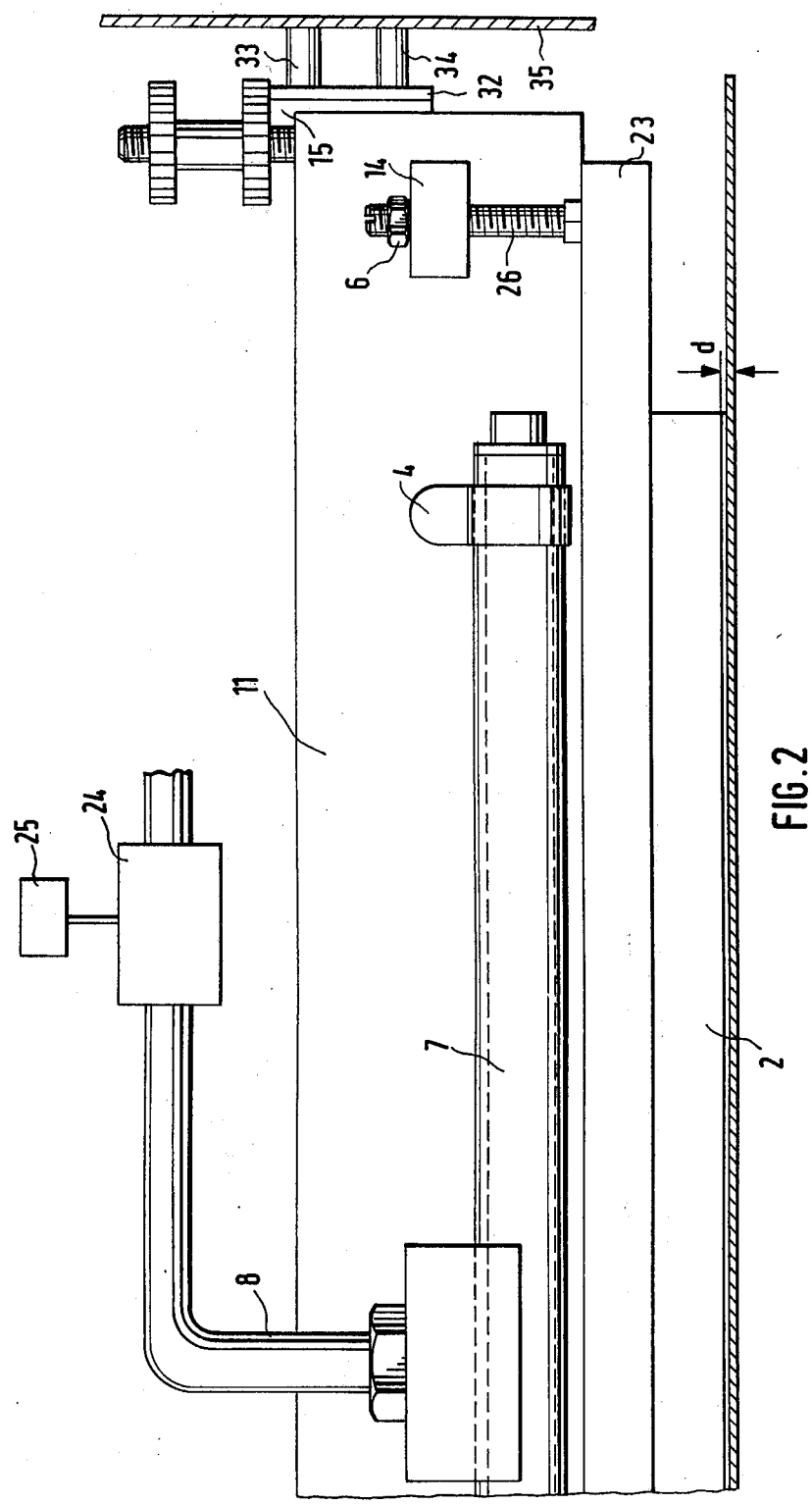

METERING DEVICE FOR LACQUER

BACKGROUND OF THE INVENTION

The present invention relates to a metering device for lacquer which is incorporated into a developing apparatus for printing plates. The device comprises at least one doctor blade made of a flexible material which is detachably mounted in a guide bar connected with a blade holder, the ends of which can be inserted from the top into a channel-section member, each which is open toward the top and has two arms joined in spaced relationship with respect to one another by way of a web. On the upper side of the blade, holder adjusting means are provided at both ends.

A doctor blade assembly of this kind is disclosed in German Offenlegungsschrift No. 2,756,932 and is equipped with holding means by which the doctor blade can be attached to two side plates of a developing machine for printing plates. Each of the channel-section members of the holding means is fastened by its web to a side plate, in such a manner that its arms point toward the inside of the developing machine, transversely to the direction of transport of the printing plates. Support means are mounted at both ends on the upper side of a carrier bar which is connected with a guide bar and, via these support means, the carrier bar and the guide bar joined to it together with the doctor blade each rest on a channel-section. In this doctor blade assembly, the guide bar with the doctor blade and also the doctor blade by itself can be removed from the developing machine, quickly and without the use of tools, for cleaning or, if necessary, exchanging these components.

From the state of the art, a further doctor blade device is known, wherein the doctor blade consists of a narrow rubber strip which is cut to size and placed into a square channel-section, the arms of which are subsequently pressed together. This channel-section serves as a guide bar for the doctor blade. In addition, the doctor blade is fastened to the channel-section by screws disposed in spaced locations. The guide bar with the inserted doctor blade has only a limited inherent stability and it is therefore screwed to a blade carrier which is attached to securing elements in the machine so that a carrier bar is formed.

It is a disadvantage of this known doctor blade device that exchanging the blade is comparatively complicated and can only be accomplished with the aid of tools. For that purpose, first the carrier bar is dismantled, then the channel-section carrying the rubber strip is completely detached, after that the screws by which the rubber strip is fastened to the guide bar are removed, and finally, the rubber strip can be replaced. This work and the ensuing reassembly often cannot be performed by the user of the machine, but only by trained servicing personnel. It is particularly difficult to renew the narrow rubber strip constituting the doctor blade, because due to the softness of the rubber material, the strip deforms when it is clamped into the guide bar, especially at the screw fastening, and it is then possible that the stripping edge of the blade may no longer be straight. As a consequence, the stripping edge must often be trimmed after the rubber strip has been clamped into the guide bar.

U.S. Pat. No. 3,983,758 discloses an assembly for fastening a sponge in an automatic processor for printing plates. This assembly varies in type from the doctor blade device of the present invention, although both serve to distribute a liquid on a printing plate. The function of the sponge, however, differs from that of the doctor blade. For spreading the liquid, the sponge is adapted to perform a reciprocating motion on the printing plate, transversely to the direction of travel of the plate. On the plate-infeed side of the processor, the reciprocating sponge rubs developer solution over the printing plate. On the plate-output side, on the other hand, the sponge is used to rub washing water over the printing plate. The sponge is inserted into a U-shaped channel which opens downwardly and is supported by a rod projecting from a side plate of the processor. The projecting end of the rod is coupled with a crank drive. At the point where the sponge rod projects from the side plate, the latter is reinforced by two slide blocks each, which encompass an opening into which the sponge rod can be placed from above. The slide blocks guide the sponge rod in the direction of the reciprocating motion, transversely to the direction of travel of the printing plate.

It is not possible to simply apply this construction of the sponge assembly to a doctor blade device, since the doctor blade must be stationarily disposed in the developing machine, and the contact pressure exerted by the blade on the printing plate must be adjusted differently than the frictional pressure exerted by the sponge.

Depending upon the purpose for which a particular blade is used in a doctor blade device, it is known either to let the doctor blade contact the surface of the printing plate exerting pressure thereupon or, if a liquid is to be metered, to leave a narrow gap between the lower edge of the blade and the surface of the printing plate. In the latter case, the gap determines the thickness of the liquid layer which is to be applied by the doctor blade.

For developing and lacquering negative-working printing plates, two machines are employed. These are (1) a developing machine, wherein the developing liquid is applied to the plate, and (2) a lacquering machine, wherein the developed printing plate is coated with a lacquer layer. This processing method using two machines is time-consuming, and it is therefore unsatisfactory for practical purposes, in particular, for use in newspaper printing shops.

SUMMARY OF THE INVENTION

It is an object of the present invention to provide a device adapted for adjustably metering the lacquer, which allows printing plates to be developed and lacquered in a time-saving manner in one operation.

It is also an object of the invention to provide an improved apparatus for developing printing plates which embodies the metering device according to the invention.

In accomplishing the foregoing objects, there has been provided in accordance with the present invention a metering device for lacquer, suitable for incorporation into a developing apparatus for printing plates, comprising a first doctor blade positioned above a printing plate passing through the apparatus; means for adjusting the height of the first doctor blade; a second doctor blade positioned parallel to the first doctor blade to define therebetween a reservoir space for a lacquer bath; means for supplying lacquer to the reservoir space; and means for adjusting the height of the second doctor blade independently of the height of the first doctor blade.

In accordance with another aspect of the present invention, there has been provided a developing apparatus for printing plates, comprising a housing; means for feeding printing plates into the housing; and means, including a metering device for applying lacquer to the printing plates, wherein the metering device comprises a metering device as defined above.

Further objects, features and advantages of the present invention will become apparent from the detailed description of preferred embodiments which follows, when considered together with the attached figures of drawing.

BRIEF DESCRIPTION OF THE DRAWINGS

In the drawings:

FIG. 2 is a front view of a section of the metering device in the vicinity of a side plate.

DETAILED DESCRIPTION OF PREFERRED EMBODIMENTS

Figure 1:
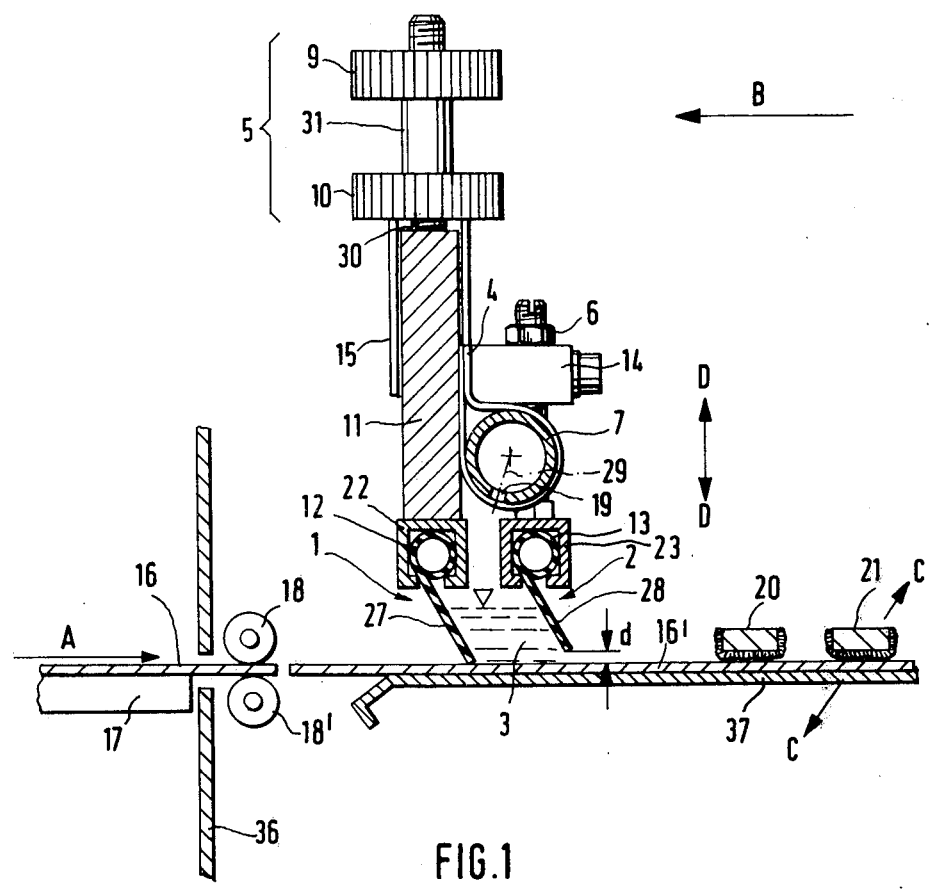
FIG. 1 is a diagrammatic sectional view of the metering device, in the direction of one of the side plates of a developing machine for printing plates.

According to the invention, a metering device is designed in such a way that a second doctor blade is provided which is arranged parallel to the first doctor blade, whereby the two blades limit a lacquer bath dammed-up between them, and the second doctor blade is connected with an adjusting means by which its height can be adjusted independently of the height of the first blade.

In one embodiment of the invention, a spray tube is arranged above the lacquer bath, which supplies lacquer to the bath and which is linked via a hose connection with a metering pump and the running time of the pump can be controlled by a timing element.

The two doctor blades have a constant distance from each other in the horizontal direction and they are both inclined with respect to the printing plate at an angle deviating from 90°. The second doctor blade, viewed in the direction of travel of the printing plate, leaves a gap between the blade underside and the printing plate surface, whereas the first doctor blade is in sealing contact with the printing plate surface.

Below, the invention is explained in more detail by reference to an example of an embodiment represented in the accompanying drawings.

The metering device represented in FIG. 1 in a diagrammatic sectional view comprises a first doctor blade 1 and a second doctor blade 2, the first blade acting as a damming-up blade and the second blade is a metering blade. The two blades are made of a flexible material, for example, of rubber, and they have head strips 12 and 13 of an approximately ring-shaped construction from which inclined sheet-formed strips 27 and 28 extend downwardly.

The head strip 12 of the blade 1 is pushed into a guide bar 22 which is comprised of a box-shaped channel-section member with an opening in the downward direction. The guide bar 22, in turn, is connected with a blade holder 11 which has a threaded bolt 30 inserted on its upper side. Two adjusting nuts 9 and 10, which are held at a distance from each other by a spacer 31, engage with this threaded bolt 30. The two one-piece nuts 9 and 10 are designed as knurled nuts. The lower adjusting nut 10 serves to adjust the height of the blade holder 11, while the upper adjusting nut 9 is used to lock the blade holder 11.

FIG. 2 depicts a view of the metering device in the direction B indicated by an arrow in FIG. 1. FIGS. 1 and 2 both show that the guiding member 15 has a U-shaped cross-section. Its two parallel arms laterally enclose the upper part of the blade holder 11. The arms are joined by a web 32, as can be seen from FIG. 2, and by this web the guiding member is fastened to a side plate 35 of the developing machine by means of two bolts 33 and 34.

FIG. 2 shows the right-hand half of the metering device only. The left-hand half, which is not shown for reasons of clarity, is identically constructed. The height of the blade 1 is adjusted in such a way that the strip 27 comes into contact with a printing plate 16' or with the bottom plate of the developing machine. The contact pressure of the strip 27 is determined by regulating the height of the blade holder 11 with the aid of the lower adjusting nut 10. When the correct height has been found, the upper adjusting nut 9 is screwed in the direction of the lower adjusting nut 10 to fix the height of the blade holder. A printing plate 16 is fed in via a feed table 17 and through a slot provided in a side plate 36 of the developing machine. The feed rollers 18 and 18' seize the front edge of the plate 16 and convey it in the direction A underneath the metering device. Viewed in the direction A, plush bars 20 and 21 are arranged behind the metering device, which perform oscillating movements transversely to the direction of travel of the printing plate 16', as indicated by the double arrow C—C. The two plush bars are the lacquering plush 20 and the rub-off plush 21.

The doctor blades 1 and 2 are arranged parallel to one another and limit a lacquer bath 3 which is dammed-up between them. A metering pump 24, the running time of which is controlled via a timing element 25 (FIG. 2), is used to build up the lacquer bath contained between the blades 1 and 2. For that purpose, a hose connection 8 leads from the metering pump 24 to a spray tube 7 which has a number of outlet openings 19 equally distributed over its length. By means of the metering pump 24 controlled via the timing element 25, the total amount of lacquer supplied only corresponds to the quantity required for developing the printing plate. Since, contrary to prior art machines, the lacquer is not applied in a circulation system, a very economical consumption of lacquer is achieved.

The center lines 29 of the outlet openings 19 of the spray tube 7 form an acute angle with the perpendicular and they point in the direction of the surface of the lacquer bath 3 enclosed by the two blades 1 and 2. It is thus prevented that a greater quantity of the lacquer is sprayed upon the outside of the guide bar 22. The doctor blade 2 is connected with an adjusting means 6 which enables an adjustment of the height of this blade, independently of the height of the blade 1. FIGS. 1 and 2 show that the doctor blade 2 leaves a gap d between its underside and the surface of the printing plate, whereas the blade 1 is in close contact with the printing plate surface. In the horizontal direction, the distance between the two blades 1 and 2 is constant and the blades are inclined toward the printing plate surface at an angle deviating from 90°. Within a particular range, any desired gap d between the lower edge of the doctor blade 2 and the surface of the printing plate can be chosen with the aid of the adjusting means 6. Through this gap d, the printing plate transported through the developing machine takes along lacquer on its surface. The desired quantity of lacquer can be metered by choosing a corresponding gap d. After the application of lacquer, the printing plate carrying the lacquer film on its surface comes into contact with the oscillating plush bars 20 and 21 and is thereby developed and simultaneously lacquered.

Close to each of its lateral ends, the guide bar 23 of the doctor blade 2 is provided with a threaded bolt 26, mounted on the upper side of the guide bar. Each threaded bolt is passed through a holding fixture 14 and engages with an adjusting means 6, for example, an adjusting screw, which is seated upon the holding fixture 14. When the adjusting screw 6 is turned, the threaded bolt 26 moves upwardly or downwardly, as indicated by the arrow D—D in FIG. 1. In this manner, the gap d between the lower edge of the strip 28 and the printing plate surface can be varied. Each holding fixture 14 is connected with the blade holder 11 and is stationarily disposed together with said blade holder. The adjusting system 5 formed by the adjusting nuts 9 and 10 and the spacer 31 makes it possible to displace the blades 1 and 2 simultaneously, since the holding fixture 14 is connected with the blade holder 11. Independently thereof, the height of the doctor blade 2 can be changed additionally by the adjusting means 6.

The spray tube 7 is held at its ends by pipe sleeves 4, the ends of which are bent together and fastened to the blade holder 11 in a manner which is not shown.

What is claimed is:

1. A metering device for lacquer, suitable for incorporation into a developing apparatus for printing plates, comprising:
   a first doctor blade positioned above a printing plate passing through the apparatus;
   means for adjusting the height of said first doctor blade;
   a second doctor blade positioned parallel to said first doctor blade to define therebetween a reservoir space;
   means for supplying lacquer to the reservoir space, said lacquer supplying means including a spray tube arranged above the reservoir space, a metering pump, a hose connection between said spray tube and said metering pump, and means for controlling the running time of said metering pump; and
   means for adjusting the height of said second doctor blade independently of the height of said first doctor blade.

2. A metering device as claimed in claim 1, wherein said first and second doctor blades have a constant distance from each other in the horizontal direction, wherein said doctor blades are both inclined with respect to the printing plate at an angle deviating from 90° and wherein said second doctor blade is spaced a distance d from the printing plate surface, and said first doctor blade is in sealing contact with the printing plate surface.

3. A metering device as claimed in claim 2, wherein said first and second doctor blades are identically constructed and each include a head strip with an approximately annular cross-section and an inclined sheet-formed strip extending downwardly from said head strip.

4. A metering device as claimed in claim 3, wherein said means for adjusting the height of said second doctor blade comprises a guide bar for holding the head strip of said doctor blade, a threaded bolt mounted on the upper side of said guide bar close to each end of said guide bar, a holding fixture through which said threaded bolt is passed and an adjusting means seated on said holding fixture which engages with the threads of said bolt.

5. A metering device as claimed in claim 4, wherein said holding fixture is connected with said means for adjusting the height of said first doctor blade and is stationarily disposed together therewith.

6. A metering device as claimed in claim 1, wherein said spray tube includes a number of outlet openings equally distributed over the length of said spray tube and wherein the center lines of said outlet openings include an acute angle with a line perpendicular to the printing plate and point toward the surface of the lacquer bath enclosed by the doctor blades.

7. A developing apparatus for printing plates comprising:
   a housing;
   means for feeding printing plates into said housing;
   means including a metering device attached within said housing for applying lacquer to the printing plates, wherein said metering device comprises a metering device as defined in claim 1.

* * * * *